United States Patent [19]
Bailey

[11] 3,953,745
[45] Apr. 27, 1976

[54] CHARGE TRANSFER DEVICE SIGNAL PROCESSING SYSTEM

[75] Inventor: Walter H. Bailey, Richardson, Tex.

[73] Assignee: Texas Instruments Incorporated, Dallas, Tex.

[22] Filed: Dec. 19, 1974

[21] Appl. No.: 534,262

Related U.S. Application Data

[62] Division of Ser. No. 320,382, Jan. 2, 1973, Pat. No. 3,877,056.

[52] U.S. Cl. ............................ 307/221 C; 307/304; 328/167; 357/24; 333/70 T
[51] Int. Cl.² .................. H03K 25/00; G11C 19/28
[58] Field of Search ............ 307/221 C, 221 D, 304; 333/18, 70 T; 357/24; 328/167

[56] References Cited
UNITED STATES PATENTS

3,746,883  7/1973  Kovac ............................ 307/221 D

Primary Examiner—John Zazworsky
Attorney, Agent, or Firm—Hal Levine; James T. Comfort; Richard L. Donaldson

[57] ABSTRACT

An improved charge transfer device signal processing system is disclosed. In one aspect of the invention the signal at each node of a bucket brigade delay line is detected to provide a continuous output signal over a major portion of a cycle of a multiphase clock. In a different aspect of the invention the signals detected at the respective nodes of a matched filter are selectively summed to negative or positive summation busses to provide an electronically programmable matched filter. In still a different aspect of the invention a charge transfer device matched filter is provided in which both the magnitude and sign of the respective weighted signals can be selectively controlled. There is also provided an improved configuration for detecting the charge required to recharge the two different electrode portions of a split electrode weighted charge coupled device matched filter.

10 Claims, 18 Drawing Figures

CHARGE TRANSFER DEVICE SIGNAL PROCESSING SYSTEM

This is a division of application Ser. No. 320,382, filed Jan. 2, 1973, issued Apr. 18, 1975, as U.S. Pat. No. 3,877,056.

The present invention pertains to signal processing systems in general, and more particularly to improved charge transfer device matched filters and signal detection configuration therefor.

Semiconductor charge transfer devices offer numerous advantages to circuit designers, particularly in the design of matched filters and delay lines. Charge transfer devices (CTD) include charge coupled devices (CCDs) and bucket brigades (BBs). A primary advantage of CTDs is their inherent simplicity and cost effectiveness. For example, a BB delay line or shift register is defined by a row of insulated gate field effect transistors (IGFETs). Connection to the respective source and drain regions is not required for BBs, thereby substantially reducing fabrication difficulty. Charge is transferred along the BB by multiphase clocks applied to the gate electrodes, direct electrical connection to doped regions being required only for inputing and outputing data. The CCD's are even more basic in structure, being defined substantially by a homogeneously doped substrate, p-n junctions being required only at the input and output of the shift register. Charge is manipulated along the shift register by multiphase clocks applied to a series of electrodes formed over the substrate and separated therefrom by a thin insulating region. The clocks generate potential wells under the electodes into which charge is "dumped."

Charge transfer devices have utility in a myriad of signal processing applications. Numerous difficulties are still encountered, however, in successfully applying CTD technology to certain device configurations. By way of example, in tapped delay lines, such as for a matched filter, conventional "tapping" configurations produce a "stepped" waveform. That is, two storage nodes are required for each bit of information in a delay line. Thus, in a two phase system, signal will be present during one clock phase, but during the next phase of the clock cycle, the signal will return in a given reference value. The stepped waveform has necessitated utilization of sample and hold circuitry etc. to mask the "return-to-reference-value" fluxation of the output signal.

To date, suitable circuitry for tapping successive bits of a CTD delay line and producing a continuous output signal over a major portion of the clock cycle is not available.

In applications which require signal summation, such as matched filters, e.g., the code configuration is typically defined during fabrication such that the resultant device configuration is effective as a matched filter for only that code. Numerous situations are presented, however, where it would be advantageous to be able to selectively program a given matched filter to a different code. At present, there are no such electronically programmable filters available.

With reference to signal detection and summation configruations for CCDs, the signal present at each stage of a CCD analog delay line is difficult to detect, particularly in matched filter applications where the gate electrode is split into two portions of varying area to effect coefficient weighting. While the clock current can be measured as an indication of signal stored in the corresponding bits of a CCD, the clock current is transitory in nature, and difficult to measure.

Accordingly, an object of the invention is the provision of an improved circuit configuration for measuring the signal at each stage of a BB analog delay line, which circuit configuration is effective to produce an output which is continuous over a major portion of a clock cycle.

A further object of the invention is the provision of an electronically programmable matched filter.

An additional object of the invention is an improved charge detection configuration for measuring the clock supply current to the two different portions of a split electrode weighted CCD matched filter.

Briefly, in accordance with the invention improved circuit configurations for use in the detection and processing of electrical charge in semiconductor charge transfer devices is provided. In one aspect of the invention a circuit configuration for detecting the charge stored at each stage of a BB analog delay line and providing an output signal over a major portion of a multiphase clock cycle, is provided. The circuit configuration is defined by high impedance taps to each node of the BB, the high impedance taps being defined by respective insulated gate field effect transistors, the gate electrodes thereof being electrically connected to the nodes. The outputs of adjacent transistor pairs are summed thereby providing a continuous output corresponding to that stage over substantially all of the multiphase clock cycle. The first transistor samples the output signal on the nodes following gates clocked on during the first half of the clock cycle. The second transistor samples the signal on the adjacent nodes following gates clocked on responsive to the second half of the clock cycle. This configuration advantageously eliminates the "return to fixed value" waveform characteristic of configurations wherein each stage is tapped only at one signal node. Preferably each transistor pair is defined so as to share a common load resistance.

In a different aspect of the invention, each stage of a charge transfer device analog delay line is tapped and the detected signal processed by a configuration effective to define a matched filter; more particularly, a matched filter which can be electronically programmed to define different codes. The programmable filter includes circuitry effective to selectively switch each stage output to either a negative or positive summation bus, and to selectively weight the signal amplitude with a pair of switching transistors coupled to each stage output, having gate electrodes for receiving code signals defining whether that stage output is to be summed on a negative bus or a positive bus. The gate signal applied to one transistor is the complement of the signal applied to the other. A second pair of transistors respectively couple the negative and positive busses to one of the two terminals of a node voltage detector transistor. The gate electrodes of the second pair of transistors are also respectively coupled to the complementary code signals. Thus, responsive to a "high" code signal, one of the first pair of transistors will be biased on, connecting a supply voltage to the drain of the node dectector transistor. Also, one of the second transistor pairs will be biased on, connecting the source of the node detector transistor to one of the summation busses. If desired, the second pair of transistors can be defined such that the gate voltage is selectively variable, i.e., is not received directly from the complementary code signal, to produce a configuration where amplitude weighting can also be selectively variable. Alternatively, the transistors are defined to have a fixed weighting value responsive to the complementary code signals.

In a further aspect of the invention, a completely integrated circuit configuration for tapping each stage of a bucket brigade delay line, selectively weighting the amplitude of the detected signal to provide a programmable matched filter function, and summing the weighted signals to provide an output is provided such that only one output connection to the chip is required, as contrasted to conventional configurations which require N outputs for an N bit filter.

In a different aspect of the invention, an improved circuit configuration for detecting the charge at each stage of a CCD analog matched filter is provided. The circuit advantageously enables processing of an essentially steady state signal as contrasted to conventional CCD tap circuits which attempt to detect signals which are transitory in nature. The circuit includes two discrete clock lines for connection to the two portions of the electrode, the relative area ratio of which defines the desired weighting. Each discrete line includes a capacitance, the value of which is much greater than the combined capacitances of the electrode portions of the respective bits connected thereto. The capacitance is charged to a reference potential responsive to a first clock signal. Responsive to a subsequent clock signal the capacitance supplies the recharge current corresponding to the signal stored in the CCD stage, discharging by an amount proportional thereto. The capacitance also is connected to the gate of an insulated gate field effect output transistor. When the capacitance is initially charged to the reference potential, the output transistor has a maximum output voltage. Upon the capacitor discharging to an essentially steady state level, the output transistor has a correspondingly lower output. This lower output corresponds to the desired signal and is conventionally measurable.

Other objects, advantages, and uses of the invention will be apparent upon reading the following detailed description of illustrated embodiments in conjunction with the drawings wherein:

FIG. 1b is a plan view showing metal-insulator-semiconductor implementation of a portion of the schematic circuit of FIG. 1a;

Figure 2A:
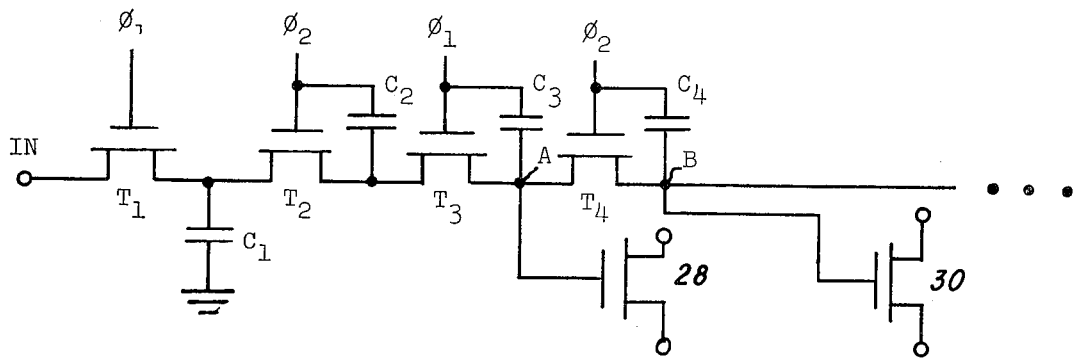
FIG. 2a is a schematic of a bucket brigade delay line effective to produce a continuous output waveform over essentially all of a clock cycle.
Figure 2B:
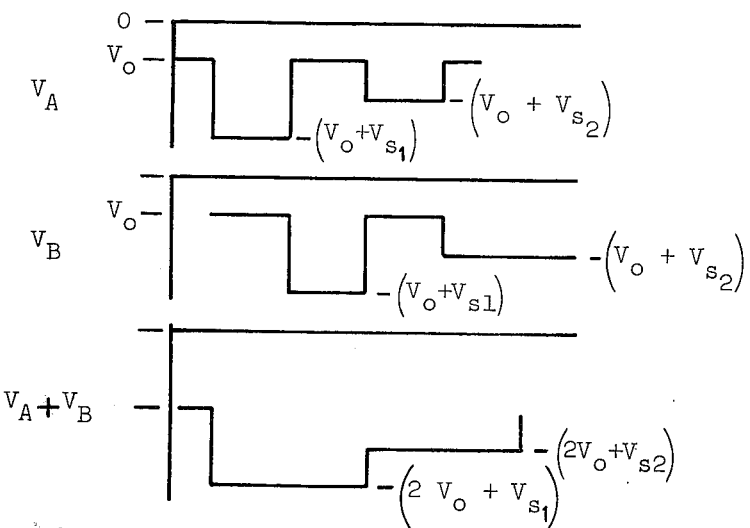
Figure 2C:
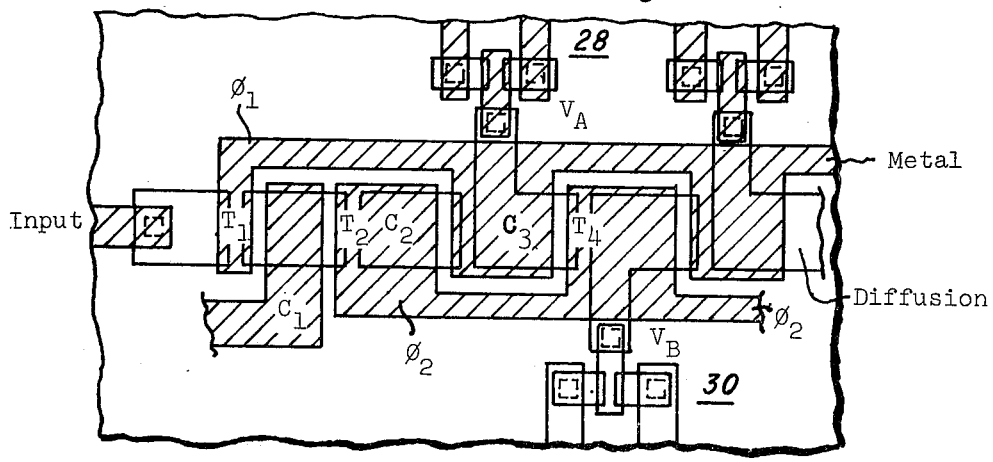
Figure 3:
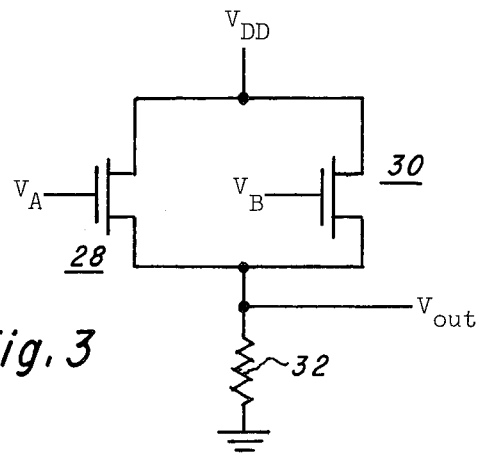
Figure 4:
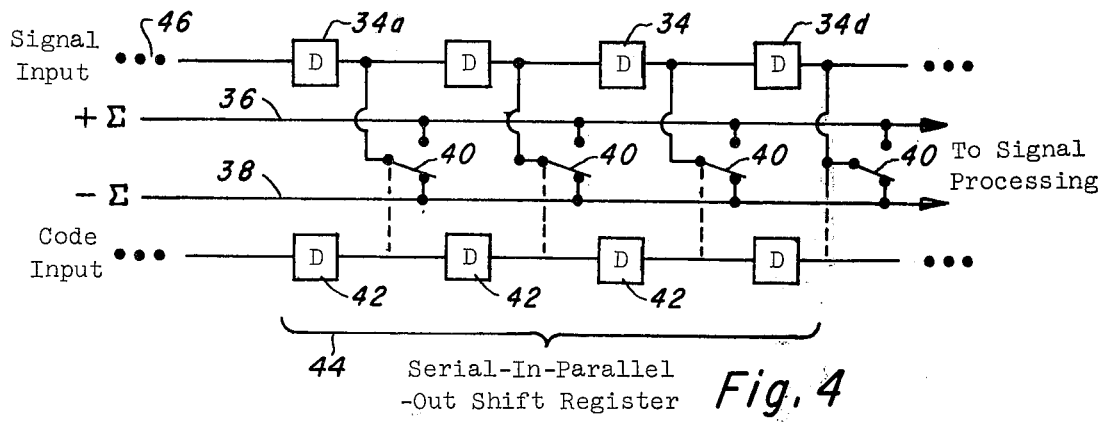
Figure 5:
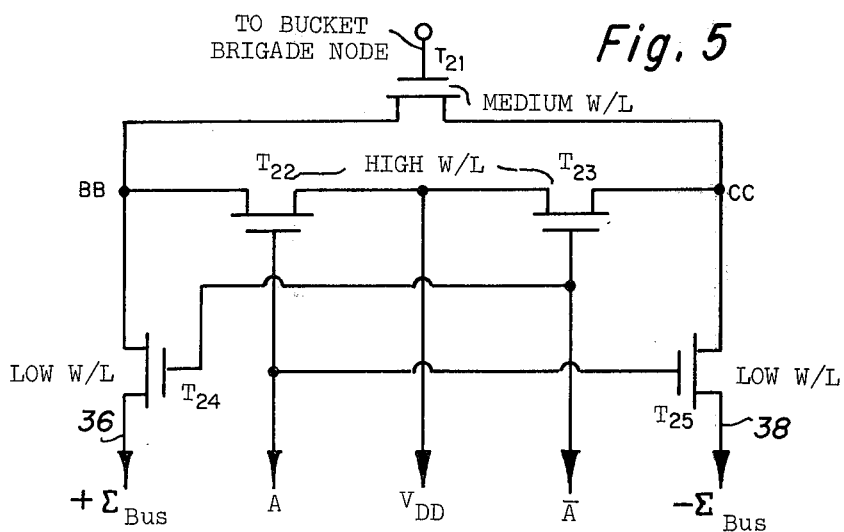
Figure 6A:
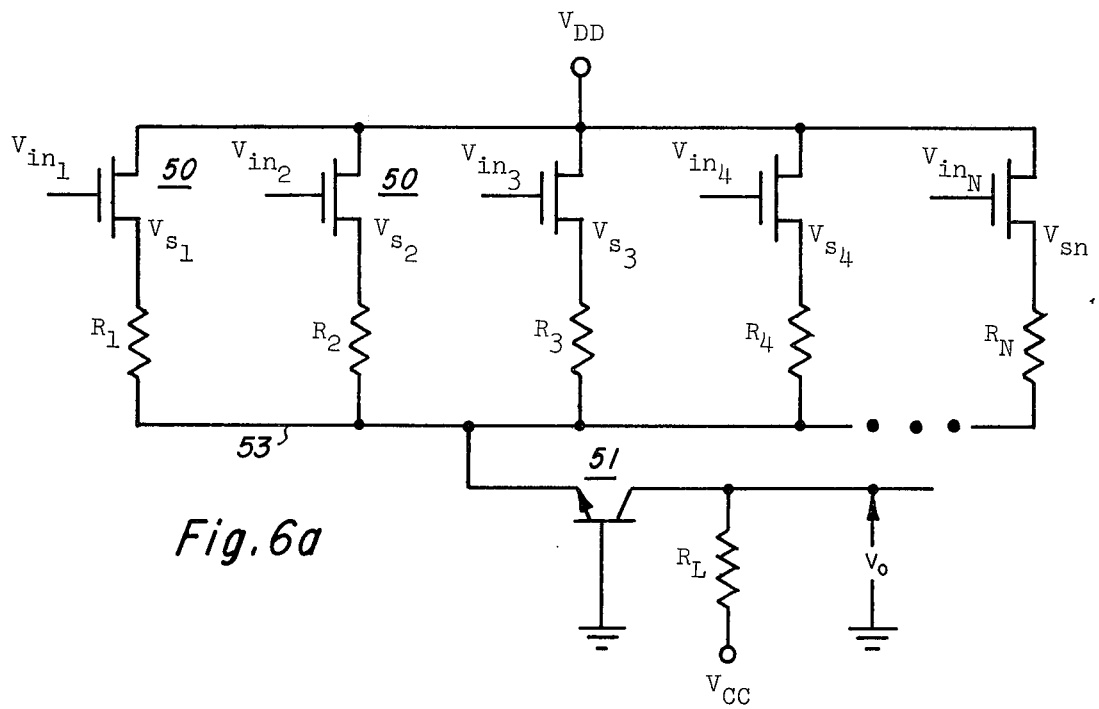
Figure 6B:
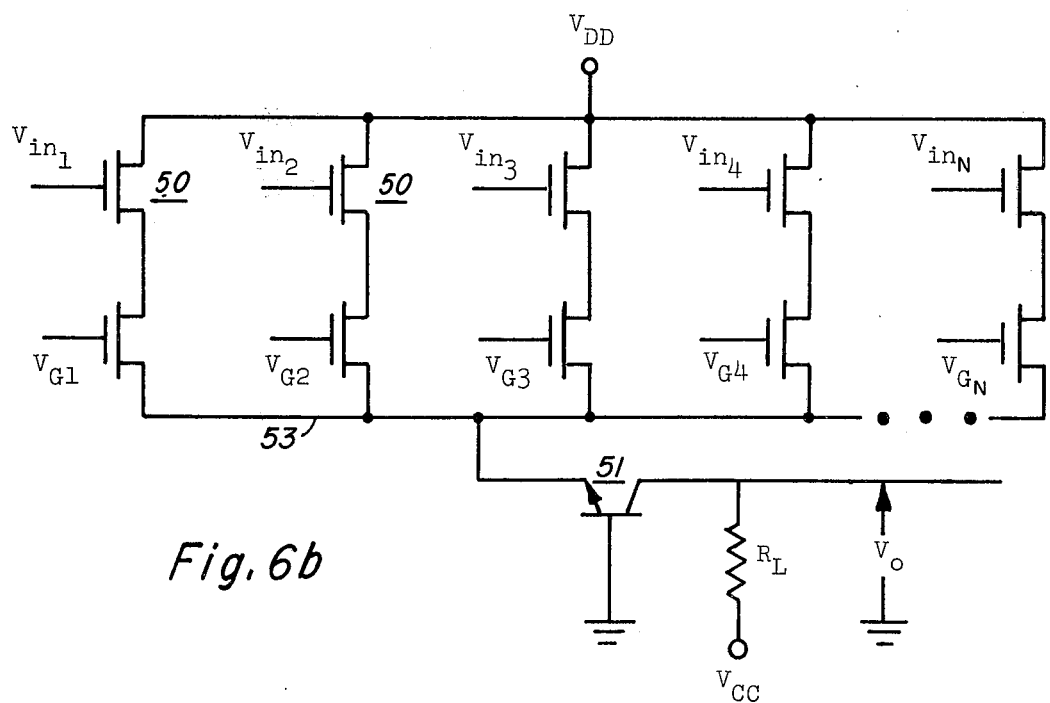
Figure 7:
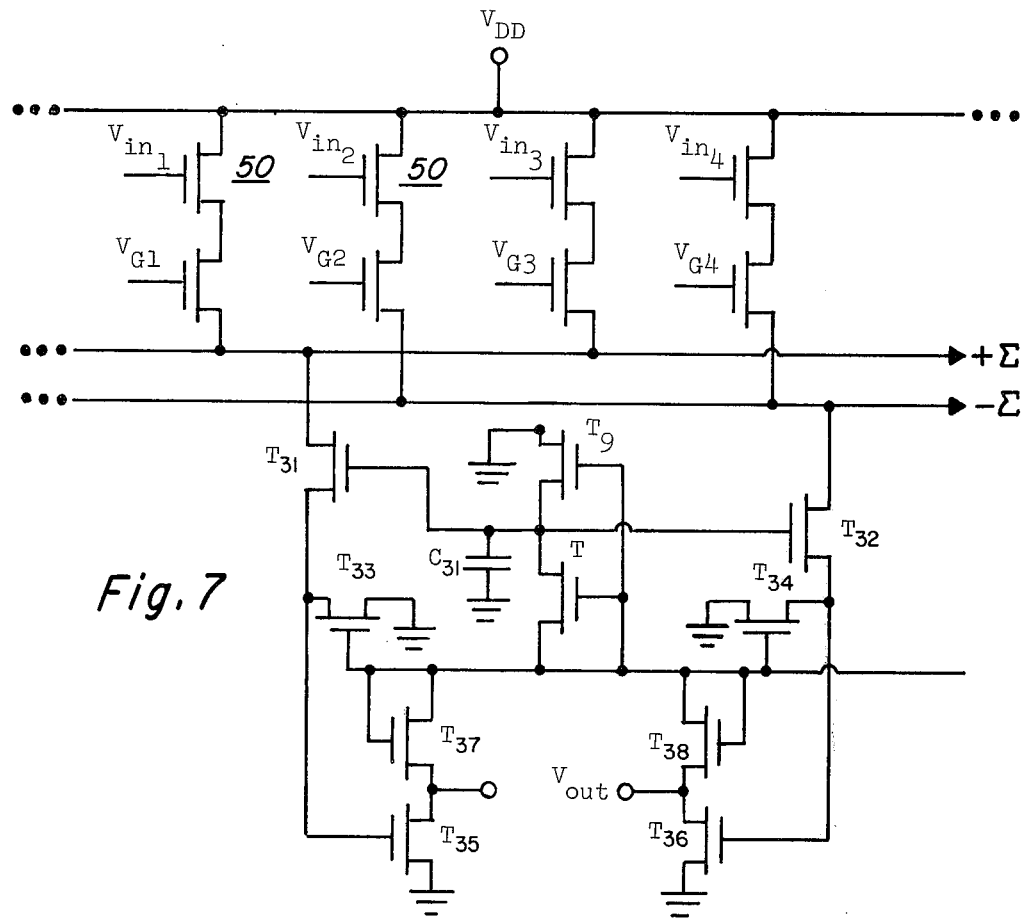
Figure 8A:
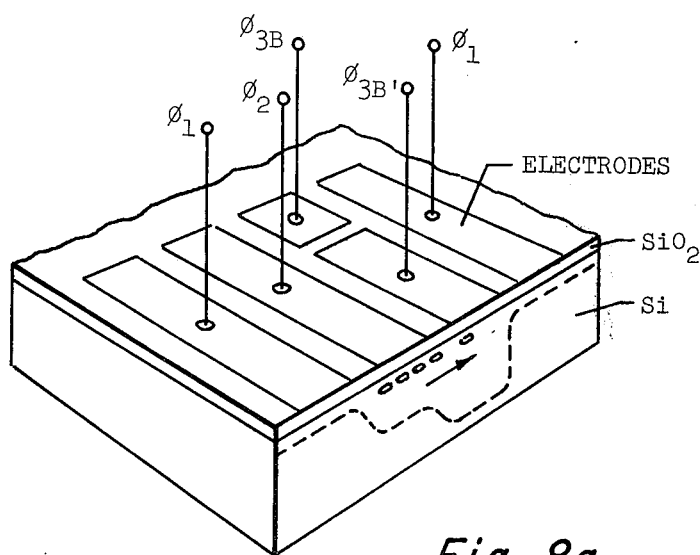
Figure 8B:
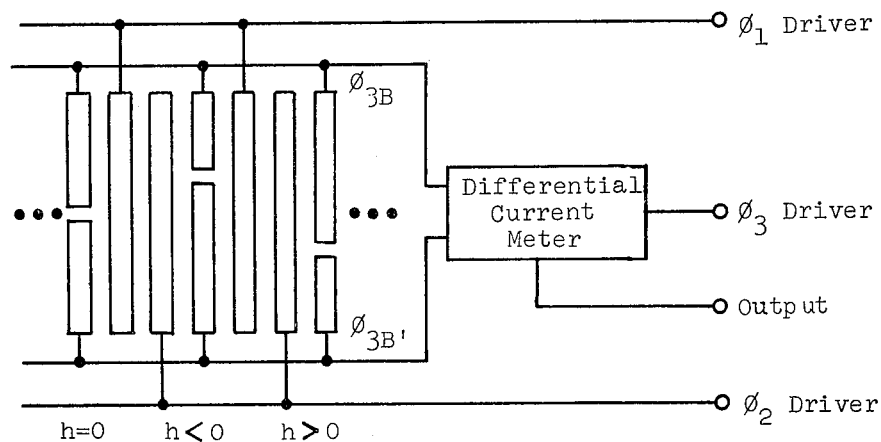
Figure 9:
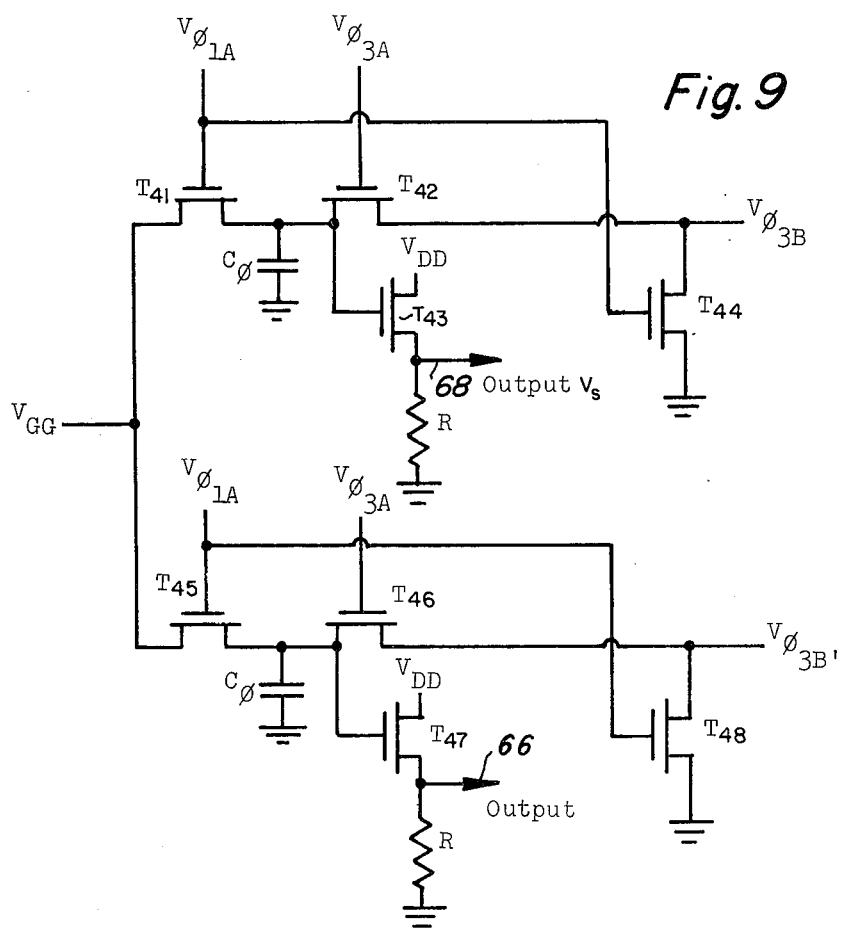
Figure 10:
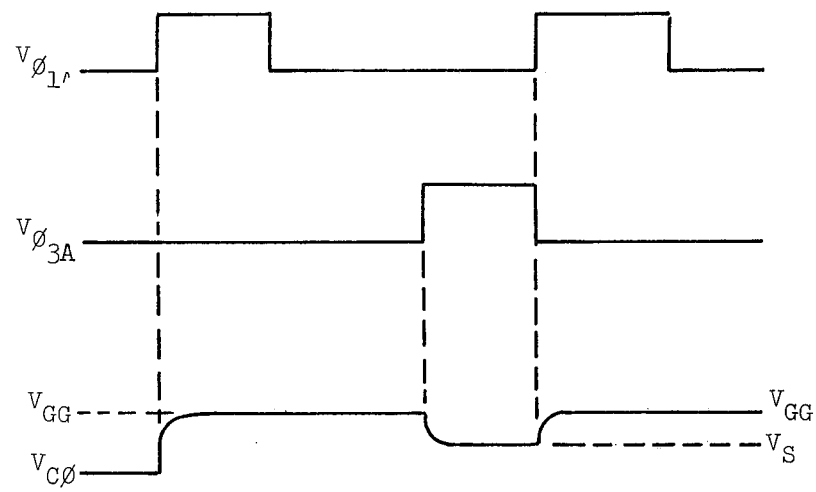
Figure 11:
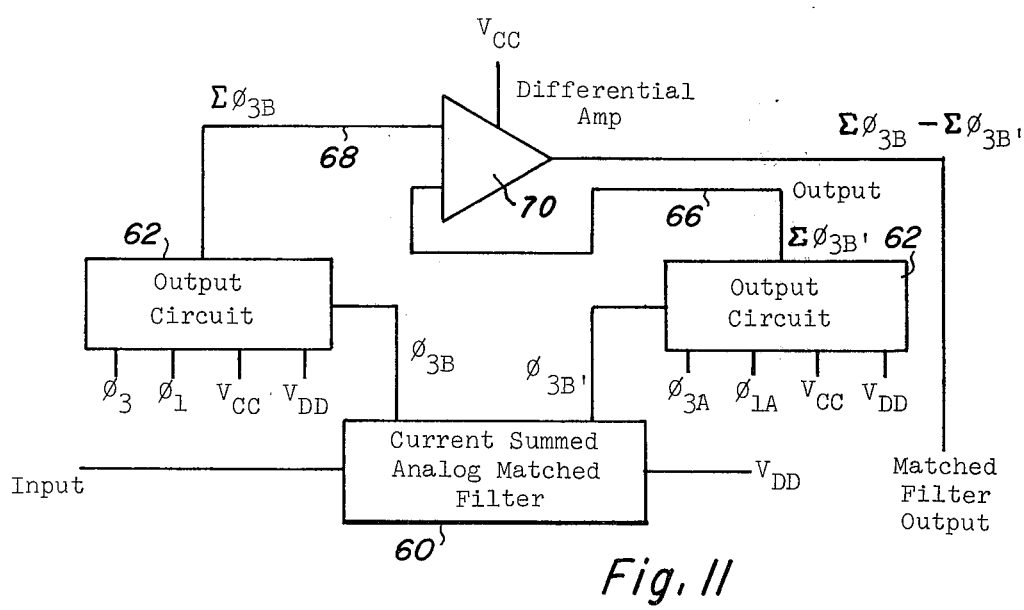

FIG. 2b graphically illustrates typical waveforms of the circuit shown in FIG. 2a;

FIG. 2c is a plan view illustrating suitable integrated circuit implementation of the circuit of FIG. 2a;

FIG. 3 is a schematic illustrating connection of a transistor pair such as illustrated in FIG. 2a wherein the transistors share a common load impedance;

FIG. 4 is a block diagram illustration of a circuit suitable for selectively connecting the output of a delay line to either a negative or positive summation bus, thereby providing an electronically programmable matched filter;

FIG. 5 is a schematic illustration of integrated circuit metal-insulator-semiconductor implementation of the selective summation circuit shown in FIG. 4;

FIG. 6a schematically illustrates a portion of a bucket brigade matched filter showing suitable signal summation;

FIG. 6b schematically illustrates utilization of a variable level impedance in the circuit of FIG. 6a;

FIG. 7 schematically illustrates a portion of a bucket brigade matched filter and associated signal processing circuitry suitable for integrated circuit implementation;

FIG. 8a and 8b pictorially and diagrammatically illustrate a portion of a three phase CCD matched filter wherein phase three electrodes are split to define preselected weighting characteristics;

FIG. 9 schematically illustrates a circuit configuration for measuring the weighted signals associated with the CCD illustrated in FIGS. 8a and 8b;

FIG. 10 graphically depicts typical waveforms of the detection circuit of FIG. 9; and FIG. 11 is a block diagram of a current summed CCD analog matched filter.

Figure 1A:
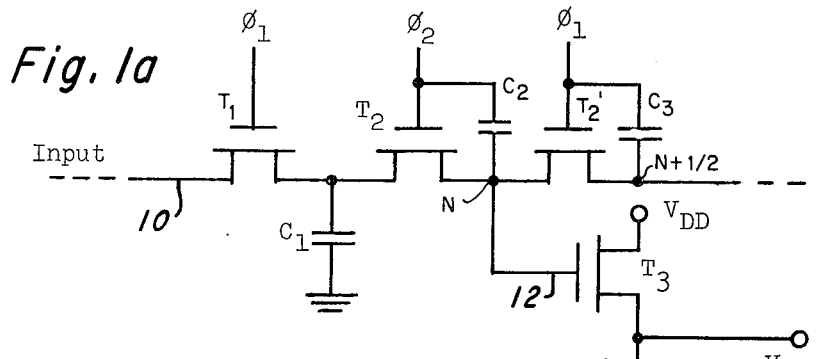
FIG. 1a is a schematic of a bucket brigade delay line illustrating a high impedance tap at a signal node.

With reference now to the drawings, FIG. 1a schematically illustrates a configuration for nondestructively accessing analog or digital information within a BB shift register. An input signal 10 is gated onto capacitor $C_1$ by clock signal $\phi_1$ biasing on transistor $T_1$. Clock $\phi_1$ is then turned off and clock $\phi_2$ goes high biasing on transistor $T_2$. The signal stored by the capacitance $C_1$ is transferred through transistor $T_2$ and is stored by the gate to drain capacitance $C_2$ of transistor $T_2$. The multiphase clock signals $\phi_1$ and $\phi_2$ define one clock cycle.

The gate electrode 12 of insulated gate field effect transistor $T_3$ is electrically connected to node N. Thus, the voltage stored by capacitance $C_2$ is applied as a gate bias to transistor $T_3$. The drain of transistor $T_3$ is connected to a supply such as $V_{DD}$ or $\phi_2$, and the source is connected to ground through a load impedance 14. The voltage generated across the load impedance responsive to a gate bias defined by the signal stored in $C_2$, provides an output signal. The load impedance 14 can be defined by another transistor, if desired.

Since the gate of transistor $T_3$ defines a high impedance, the signal stored at $C_2$ is nondestructively sampled. Thus, the signal at each bit of the BB can be sampled at a note "N" ($C_2$) following the transistor receiving a $\phi_2$ clock, or at a node "N+½" ($C_3$) following the transistor $T_2$' of the same but receiving a $\phi_1$ clock.

Figure 1B:
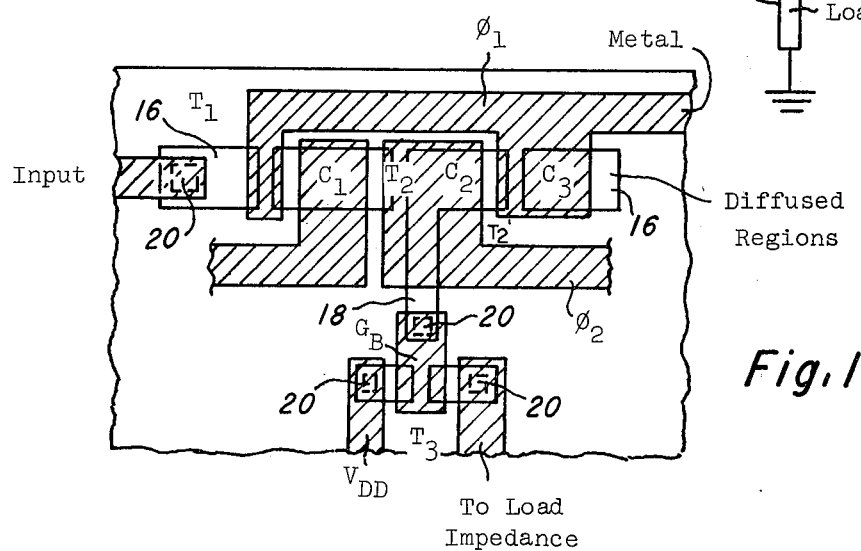

The circuit illustrated in FIG. 1a can be defined in integrated circuit format using conventional fabrication techniques well known in the art. A typical integrated circuit layout is shown in FIG. 1b wherein doped regions, shown generally by the plain enclosed doped regions, such as 16, are defined in a semiconductor substrate such as silicon (not shown) by suitable techniques as diffusion and ion implantation. The doped regions defined the source and drain regions of the IGFETs defining the BB. A typical high impedance tap to the gate electrode of transistor $T_3$, e.g., is shown at 18, which lies exclusively under the $\phi_2$ metallization which also forms the storage capacitance $C_2$ for this node. The doped regions are covered with a thin insulating layer (not shown), such as silicon dioxide. A metallization pattern, shown as cross hatched regions, is conventionally defined over the insulating layer to form the clock lines $\phi_1$ and $\phi_2$, capacitances $C_1 - C_3$ and gate electrodes for the respective transistors. As illustrated in FIG. 1b, the gate metallization of transistors $T_1$ and $T_2$ extends over a substantial portion of the underlying doped drain region to enhance gate-drain capacitance for charge storage. Apertures or via holes 20 are opened through the insulating layer in regions where ohmic connection between doped regions on the substrate and the metallization is required.

Figure 1C:
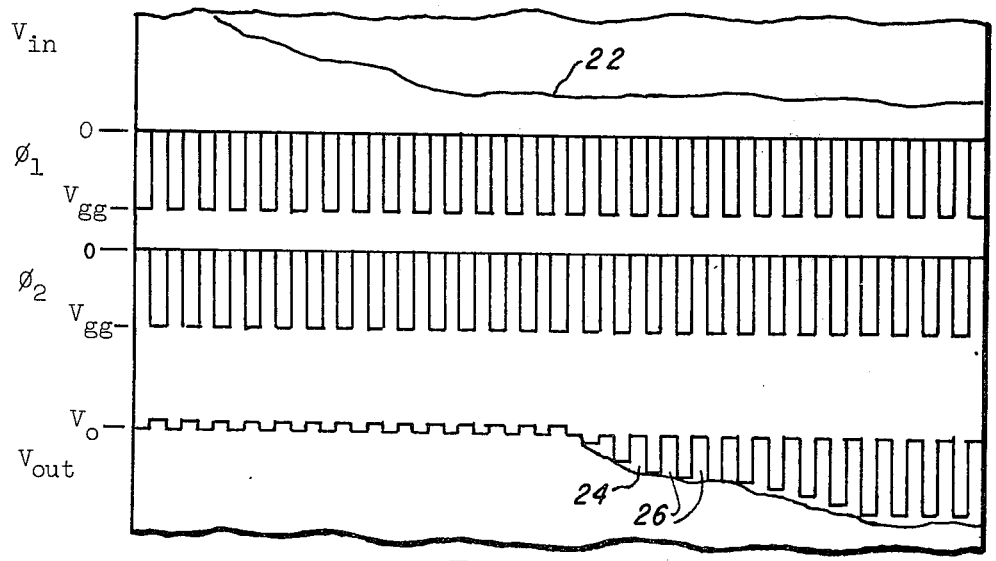
FIG. 1c is a graphic illustration of typical waveforms produced by the tapped delay line of FIG. 1c.

With reference to FIG. 1c typical waveforms associated with the tapped circuit configuration of FIG. 1a are illustrated. An input signal defines an envelope 22. The input signal is clocked into the analog delay line by clocks $\phi_1$ and $\phi_2$.

The output 24 is the input voltage (which is sampled during the $\phi_1$ ON time) delayed in time by the product of the number of stages between the input and the sampling location and the period of the clock. If the sampling taps are located on nodes preceeded by $\phi_1$ clocks, an integral number of stages delay will result. If the taps are located on nodes which follow $\phi_2$ clocks, an integral number + ½ stages delay will result.

The gaps shown generally at 26 in the output waveform which occur on alternate clock pulses make signal processing difficult. Information contained in the amplitude of the output pulses can be processed, but the processing requires sample-and-hold techniques to mask the "return to fixed value" situation. That is, during alternatie clock periods the output returns to a reference potential $V_o$, producing a "stepped" output signal.

With reference to FIG. 2a there is illustrated a circuit configuration in accordance with the invention for producing an output signal that is continuous over substantially the entire clock cycle. This configuration employs the fact that the desired signal amplitude exists on the node A following gates clocked by $\phi_1$ during the half cycle when $\phi_1$ is ON and on the adjacent node B following gates clocked by $\phi_2$ during the half clock cycle when $\phi_2$ is ON. Node voltages $V_A$ and $V_B$ are detected at adjacent nodes by the gates of IGFETs 28 and 30. By summing the signals detected at the adjacent nodes "A" and "B" the waveforms shown in FIG. 2b are produced. It will be noted that the "return to fixed value $V_o$" output condition is eliminated by summation of adjacent half-bit signals $V_A$ and $V_B$.

Preferably, the adjacent output transistors 28 and 30 are connected as a source follower with a common source impedance 32 as shown in FIG. 3. In operation, the output voltage Vout will attempt to be forced to $V_A - V_T$ or $V_B - V_T$. However, if $V_A \neq V_B$, then the device having the lower gate potential will be cut off ($I_o = 0$) allowing the output voltage to follow the large of $V_A$ or $V_B$ such that $$|Vout| = V_s + V_o$$

where
$V_S$ = Signal Voltage
$V_O$ = Quiescent Output Voltage

Classical voltage summation of $V_A$ and $V_B$ as previously described with reference to FIG. 2b will give the following output voltage $$Vout = V_s + 2 V_o$$

over the whole period of a clock pulse cycle

A suitable integrated circuit layout for the configuration of FIG. 2a is shown in FIG. 2c. Again, conventional integrated circuit fabrication techniques can be utilized.

With reference to FIG. 4 there is illustrated in block diagram format a programmable matched filter in accordance with the present invention. Discrete stages of a delay line are shown generally at 34. Negative and positive summation busses are shown at 36 and 38. These busses are selectively connected to respective bits 34 of the delay line by switches shown generally at 40. Charge stored at respective bits of the delay line may be detected by a detector as shown in FIG. 1a or, preferably, as shown in FIG. 2a the outputs from the detectors being applied to bus 36 or bus 38 as determined by the switches 40. The switches 40 receive inputs from a serial-in parallel-out shift register 44 having stages shown generally at 42. Responsive to signals from the shift register 44, such as 1's or 0's, the switches connect corresponding stages 34 to either the negative or positive bus 36 or 38. By way of illustration, a digital code of 1001 could be serially read into shift register 44. Assuming, e.g., that 1 is effective to cause switches 40 to connect stages 34 to the summation bus 36, and a zero to connect bits 34 to bus 38, then the first and fourth bits 34a and 34d would be connected to bus 36, while the middle two stages would be connected to bus 38. Responsive to an input signal at 46 corresponding to 1001, then a correlated output would be produced by signal processing circuitry (not shown) connected to busses 36 and 38. Thus, the matched filter can be programmed simply by changing the code input to shift register 44.

With reference to FIG. 5 a suitable circuit for implementing the switches 40 for connection to a BB analog delay line is illustrated.

In operation, the voltages applied at A and $\overline{A}$ are typically either zero volts or a supply voltage $V_Z$ with the usual logic interpretation applied to A and $\overline{A}$. If input A is connected to $V_Z$ (and $\overline{A}$ is connected to zero volts), the voltage at node BB will become $V_{DD}$ or $V_Z - V_T$ ($V_T$ is the IGFET threshold voltage) whichever is smaller provided $[(W/L)_{T22}/(W/L)_{T21}]$ is very large (FIG. 5). W/L represents the width-to-length ratio of the channel of the transistor. Operating in this manner, device $T_{22}$ acts to short (i.e. has a low resistance) node B to $V_{DD}$ and device $T_{25}$ acts as a source load for detector transistor $T_{21}$. The drain of device $T_{25}$ acts as a source load for device $T_{21}$. The source of device $T_{25}$ is then connected to a low impedance current summation node such as the emitter of a common base bipolar transistor amplifier or the source of a common gate IGFET amplifier. Since zero volts are applied to input $\overline{A}$, $T_{23}$ and $T_{24}$ are held OFF disabling the tap from the +Σbus. Reversing the A and $\overline{A}$ inputs will permit the +Σbus to be enabled and the −Σbus to be disabled. This circuit can also be used for voltage summation schemes by switching the signal voltage between nodes BB and CC. This scheme is also applicable to inverter amplifier configurations (as opposed to this source follower configuration) by rearrangement of biasing.

With reference to FIG. 6a, a circuit is illustrated which is effective to perform linear summation of signals in analog matched filters. The circuit enables choice of both weighting coefficient amplitude and sign. The summation circuit can be used, e.g., to sum the signals at the negative and positive busses 36 and 38 (FIGS. 4 and 5). Linear summation is difficult in integrated circuits since most active devices possess square law I-V characteristics. Thus, typical summation schemes perform a "square root of the sum of the squares" type summation which is undesirable for matched filter applications because of signal-to-noise ratio degradation.

The input voltages $V_{in_1} - V_{in_N}$ are appropriate node voltages in the Bucket Brigade shift register, detected, e.g., by connection of the gates of transistors 50 as illustrated in FIG. 2. For the small signal case, the source followers, shown generally at 50, connected to each Bucket Brigade node have essentially unity gain (provided the $R_N$'s are large) such that $$V_x \sim V_{in}$$

The load resistors $R_1 \ldots R_N$ are connected to a summation bus 53 which in turn is connected to the emitter of common base amplifier 51. Then, since the common base amplifier 51 (or any other low input impedance, constant current gain, high output impedance amplifier such as a common gate amplifier or some operational amplifier configurations) has a low input impedance, $r_e$, relative to the source resistance ($R_N >> r_e$), the current flowing through the source resistor $R_N$ is a linear function of the input voltage such that $$i_N = \frac{V_{in_N}}{R_N}.$$

The low impedance of the common base stage 51 isolates the current contributions of each of the N input devices from each other. Thus, $$i_e = i_1 + i_2 + i_3 + i_4 + \ldots + i_N.$$

Since for the common base amplifier $$i_c \approx \alpha i_e \approx i_e - \Sigma (N)$$

and its a.c. output voltage then becomes $$V_O - R_L i_c = R_L [\Sigma i_N]$$
$$= R_L \left[ \frac{V_{in_1}}{R_1} + \frac{V_{in_2}}{R_2} + \frac{V_{in_3}}{R_3} + \frac{V_{in_4}}{R_4} + \ldots + \frac{V_{in_N}}{R_N} \right].$$

In general, the output voltage $V_O$ of an analog matched filter is defined by the expression $$V_O = A_1 V_{in_1} + A_2 V_{in_2} + A_3 V_{in_3} + A_4 V_{in_4} + \ldots + A_N V_{in_N}$$

where the weighting coefficient $A_N$ is $$A_N = \frac{R_L}{R_N}$$

Thus, it can be seen that the configuration of FIG. 6a enables for formation of a weighted linear sum of the appropriate node voltages in a Bucket Brigade shift register, which is necessary in the implementation of a Bucket Brigade analog matched filter. This approach may be extended to the use of an IGFET load, as illustrated in FIG. 6b, for the source resistance with proper attention given to the relative W/L ratios of the two devices at each summed node for coefficient determination. The weighting coefficient amplitude can be controlled by fixing the coefficient during design by selecting the proper W/L ratios for the active and load devices associated with each summed node, or by varying the effective load resistance by varying the gate voltage ($V_{g_N}$) of the load devices in each source follower device pair.

Negative weighting coefficients may be realized by making use of positive summation (+Σ) and negative summation (−Σ) busses, each utilizing a low input impedance, high output impedance, constant current gain amplifier as previously described with reference to FIG. 6. The output voltages of these two constant current gain amplifiers can be subtracted (thus implementing the negative coefficient) by applying them to the two inputs of a differential amplifier such that its output is $$V_O = K[V_{+\Sigma} - V_{-\Sigma}]$$

where $K$ is a gain factor. Negative weighting coefficients can be implemented by (1) bringing the +Σ and −Σ busses off the chip and using external (to the chip) components for the remainder of the summation circuitry of (2) by an all IGFET amplifier scheme which can be fabricated as a single integrated circuit, such as is schematically illustrated with reference to FIG. 7.

With respect to FIG. 7, transistor pairs $T_{31} - T_{33}$ and $T_{32} - T_{34}$ serve as common gate transistor amplifiers for the +Σ and −93 busses respectively. The gates of $T_{31}$ and $T_{32}$ are clamped to a d.c. potential established by the $T_{39} - T_{40}$ voltage divider and bypassed to ground with an MOS capacitor $C_{31}$. This voltage divider can also be implemented with diffused resistors, or an additional external supply can be used. Transistors $T_{35}$, $T_{36}$, $T_{37}$, and $T_{38}$ form a linear IGFET differential amplifier. Relative gains are determined by the choices of W/L ratios.

With respect to FIG. 8a a portion of a CCD matched filter is illustrated wherein weighting is effected by dividing an electrode, such as the $\phi_3$ electrode in the illustrated three phase system, into two portions, the relative area ratio defining the weighting. The signal can be detected in the manner illustrated by FIG. 8b by measuring or summing the signal related current required to charge all of the upper $\phi_B$ electrode portions (the positive summation bus, e.g.) and also measuring the signal current in the lower $\phi_3$ electrode portions (the negative bus, e.g.), such as with a differential amplifier as shown in FIG. 8b.

A detector circuit in accordance with the invention for detecting the charge stored at the $\phi_{3B}$ and $\phi_{3B'}$ electrodes of FIG. 8b and producing related signal outputs is shown with reference to FIG. 9. This circuit configuration is particularly advantageous in that an essentially "steady-state" signal is processed as contrasted to conventional current summation configuration wherein transitory signals are generally processed.

In operation, capacitance $C\phi$ charges to the smaller magnitude of $V_{\phi\,1A} - V_T$ or $V_{GG}$, preferably $V_{GG}$, when $V_{\phi\,1A}$ is turned ON. ($V_{\phi\,3A}$ is turned OFF) through IGFET $T_{41}$. Meanwhile IGFET $T_{44}$ is turned ON creating a low impedance charging path by means of which the charge stored under the $\phi_3$ electrodes is transferred to a new location under the $\phi_1$ electrode of the succeeding bits. Clock $V_{\phi\,1A}$ is turned OFF while $V_{\phi\,3a}$ is held OFF holding the voltage across $C_1$ at $V_{GG}$ (or $V_{\phi\,1S} - V_T$). Clock $V_{\phi\,3A}$ is then turned ON while $V_{\phi\,1A}$ is held OFF. This turns IGFET $T_{42}$ "ON" causing a transient current to flow in $V_{\phi\,3B}$. This transient current flows from $C\phi$ causing a slight decrease in this capacitance's stored voltage, according to $V = V_{GG} - C\phi \int i\, dt$.

In order to have the $V_{GG}$ supply serve as the amplitude of the CCD clock supply voltage it is necessary that $$V_{\phi\,3,1} > V_{GG} + V_T \text{ and } V_{\phi\,1,1} > V_{GG} + V_T$$

and $$C\phi > \Sigma_N C_N$$

where $C_N$ is the capacitance of the CCD electrodes.

The output signal is taken from the source follower comprised of IGFET $T_{43}$ and load Resistance R. The output signal voltage is thus the difference in voltage across the fully charged capacitor $C\phi$ and the voltage existing across $C\phi$ following the decay of the above described transient current. Since the voltage across $C\phi$ prior to the charge transfer transient is always the same value, $V_{GG}$, if the above criterion are met, the information signal $V_s$ can be considered to be only the voltage across $C\phi$ after the charge transfer transient. Typical clock voltages and output voltage waveforms are shown in FIG. 10.

The main advantage of this output circuit is that it permits the observance of a difference in voltage across a capacitor after a charge transfer transient has decayed as opposed to distinguishing differences in the charge transfer transients themselves, thus simplifying signal processing circuitry. This signal processing scheme is applicable to Charge Coupled Devices as well as to Bucket Brigade Devices.

With reference to FIG. 11, there is a block diagram illustration of an analog matched filter utilizing the output detection circuitry of FIG. 9. A current summed CCD analog matched filter, e.g. as shown in FIG. 8b, is shown generally at 60. For the illustrated embodiment, only the phase three electrodes are weighted. The output circuits 62 are similar to those in FIG. 9. The negative and positive summation busses, i.e., the output 66 and 68 (FIG. 9) are connected to a conventional differential amplifier 70. A suitable amplifier 70 is SN 72741 manufactured by Texas Instruments Incorporated, Dallas, Tex.

While the present invention has been described with respect to detailed embodiments, it will be apparent to those skilled in the art that various changes can be made without departing from the spirit or scope of the invention.

What is claimed is:
1. A programmable matched filter comprising:
   a. delay line means having a plurality of stages each defining at least one signal storage node;
   b. for each said stage, detector means connected with a said storage node of said stage for non-destructively sampling signals stored at said stage and producing a corresponding detected signal at an output of said detector means;
   c. a negative signal summation bus and a positive signal summation bus for simultaneously receiving selected ones of said detected signals;
   d. switching means connected to said output of each of said detector means for selectively connecting said output to either said negative summation bus or to said positive summation bus responsive to a logic signal applied to said switching means;
   e. selectively controllable logic means connected to said switching means for simultaneously applying said logic signals to said switching means in a code corresponding to a selectable matched filter function; and
   f. output means connected to said summation buses for algebraically summing said detected signals selectively connected to said negative and positive buses.

2. A programmable matched filter as set forth in claim 1 wherein said delay line means comprises a bucket brigade analog shift register.

3. A programmable matched filter as set forth in claim 2 wherein said detector means comprises an insulated gate field effect detector transistor, having a gate electrode ohmically connected to a storage node in each stage of said shift register.

4. A programmable matched filter as set forth in claim 1, wherein said delay line means comprises a bucket brigade analog shift register having a plurality of stages, each said stage including two charge storage nodes; and wherein said detector means comprises, for each stage, first and second insulated gate field effect detector transistors, each said detector transistor having a source electrode commonly connected to a load impedance; said first and second transistors having gate electrodes connected respectively to said storage nodes of said stage, such that during each said transfer clock pulse cycle said first and second detector transistors successively apply detected signals to said load impedance whereby an output signal is produced across said load impedance over substantially the whole period of each said clock pulse cycle.

5. A programmable matched filter as set forth in claim 3, wherein said switching means comprises:
   a. first and second insulated gate field effect switching transistors having gate electrodes for respectively receiving complementary logic signals; means connecting the source electrodes of said switching transistors respectively to the source and drain electrodes of said detector transistor; and
   b. third and fourth insulated gate field effect transistors; means connecting the source electrodes of said third and fourth transistors respectively to said positive and negative summation buses; means connecting the drain of said third transistor in common with the source of said first switching transistor; means connecting the drain of said fourth transistor in common with the source of said second switching transistor; and means connecting the gate electrode of said second switching transistor and the gate electrode of said third transistor in common to a first logic input terminal; and means connecting the gate electrode of said first switching transistor and the gate of said fourth transistor in common to a second logic input terminal; and
   c. means for simultaneously applying complementary logic signals to said first and second logic input terminals;
   d. whereby application of a logic 1 signal to said first logic input terminal simultaneously with application of a complementary logic 0 said second input terminal, effects connection of the said detector transistor output to said negative summation bus by switching said first switching transistor and said fourth transistor to a conductive state while switching said second switching transistor and said third transistor to a non-conductive state; and whereby application of a logic 0 signal to said first logic input terminal simultaneously with application of a complementary logic 1 signal to said second logic input terminal, connects said detector transistor output to said positive summation bus by switching said second switching transistor and said third transistor to a conductive state while switching said first switching transistor and said four transistor to a non-conductive state.

6. A programmable matched filter as set forth in claim 5, wherein said selectively controllable logic means comprises a serial-in, parallel-out coding shift register, and means for inputting a predetermined sequence of binary logic signals into said coding shift register to define a selected matched filter function.

7. A programmable matched filter according to claim 1, further including, for each said bus:
a common-base bipolar transistor amplifier; means connecting said bus to the emitter of said common-base bipolar transistor amplifier; and means connecting the collector of said bipolar transistor amplifier to a load resistance, whereby said detected signals applied from said bus to the emitter of said bipolar transistor amplifier are summed and produce a corresponding current flow through said load resistor.

8. A programmable matched filter according to claim 1, wherein said output means comprises:
 a. a pair of common-gate insulated gate field effect transistor amplifiers having inputs respectively connected to said negative and positive summation buses; and
 b. a linear insulated gate field effect transistor differential amplifier having a pair of inputs, means connecting said inputs respectively to the outputs of said common gate amplifiers, said differential amplifier providing an output signal for said matched filter which is effectively the difference between the sum of said detected signals applied to said positive summation bus and the sum of said detected signals applied to said negative summation bus.

9. A programmable matched filter comprising:
 a. charge transfer delay means having a plurality of stages each defining at least one signal storage node;
 b. positive and negative signal summation buses;
 c. detector means for each stage of said delay line, each detector means including:
  i. an insulated gate detector field effect transistor;
  ii. means connecting the gate of said detector field effect transistor to a storage node of said stage for detection of the level of charge stored at said stage to produce a corresponding detected signal;
  iii. an insulated gate field effect transistor load impedance connected in series with said detector transistor, said load impedance transistor having a selectively variable impedance defining a predetermined weighting factor for weighting the amplitude of said detected signal;
 d. switching means connected to each said detector means for selectively connecting said weighted outputs either to said negative summation bus or to said positive summation bus responsive to a logic signal applied to said switching means;
 e. control means connected to said switching means for simultaneously applying said logic signals to said switching means in a code corresponding to a selectable matched filter function;
 f. output means connected to said summation buses for algebraically summing said weighted detected signals selectively connected to said negative and positive summation buses, said output means comprising:
  i. a pair of insulated gate field effect transistor amplifiers having inputs respectively connected to said negative and positive summation buses; and
  ii. a linear insulated gate field effect transistor differential amplifier having a pair of inputs, means connecting said inputs respectively to the outputs of said amplifiers, said differential amplifier providing an output signal for said matched filter which corresponds effectively to the difference between the sum of said weighted detected signals applied to said positive summation bus and the sum of said weighted detected signals applied to said negative summation bus.

10. A programmable matched filter according to claim 9 wherein said switching means comprises an insulated gate field effect transistor switching circuit.

* * * * *